United States Patent [19]

Goujon et al.

[11] 4,037,156
[45] July 19, 1977

[54] POWER SUPPLY TESTING APPARATUS

[75] Inventors: Roger Hubert Goujon; Jacques Pierre Raymond Raphael Menard; Georges Claude Andre Pagny, all of Angers, France

[73] Assignee: Compagnie Honeywell Bull (Societe Anonyme), Paris, France

[21] Appl. No.: 677,254

[22] Filed: Apr. 15, 1976

[30] Foreign Application Priority Data

Apr. 30, 1975 France .................................. 75.13698

[51] Int. Cl.² .............................................. G01R 31/00
[52] U.S. Cl. ............................. 324/158 R; 324/57 R; 324/73 R
[58] Field of Search ................ 324/158 R, 57 R, 73 R

[56] References Cited

U.S. PATENT DOCUMENTS 3,383,589  5/1968  Dugan, Jr. ......................... 324/158 R
3,624,489  11/1971  Betton .................................. 324/57 R Primary Examiner—Rudolph V. Rolinec
Assistant Examiner—Ernest F. Karlsen
Attorney, Agent, or Firm—Lowe, King, Price & Markva

[57] ABSTRACT

Power supplies having power input excitation terminals and power output terminals are tested under differing load and excitation conditions. Excitation sources having differing parameters are selectively connected to the input terminals. A variable impedance load is connected to the output terminals. Voltage measuring apparatus is selectively connected to be responsive to the voltage derived from the selective connecting means and the voltage across the load and is selectively connected to a readout means. A dynamic signal source derives control signals for respectively controlling the parameters of the excitation sources, the impedance of the load, and the connections of the readout means and the measuring apparatus.

18 Claims, 7 Drawing Figures

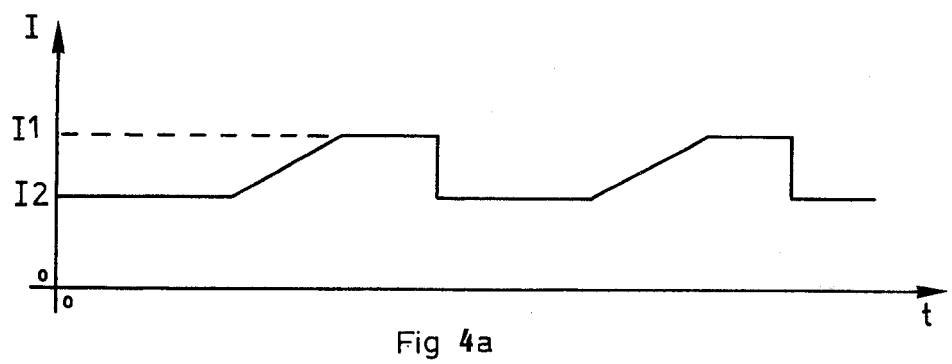
Fig 4a
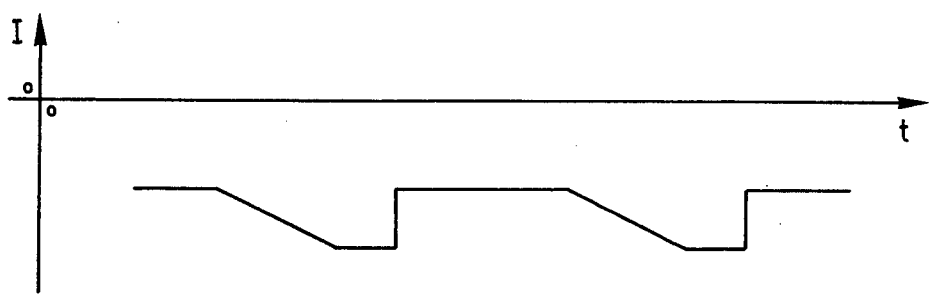
Fig 4b
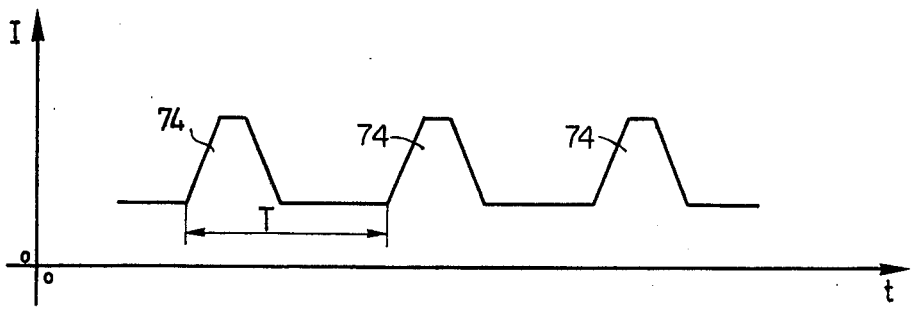
Fig 4c
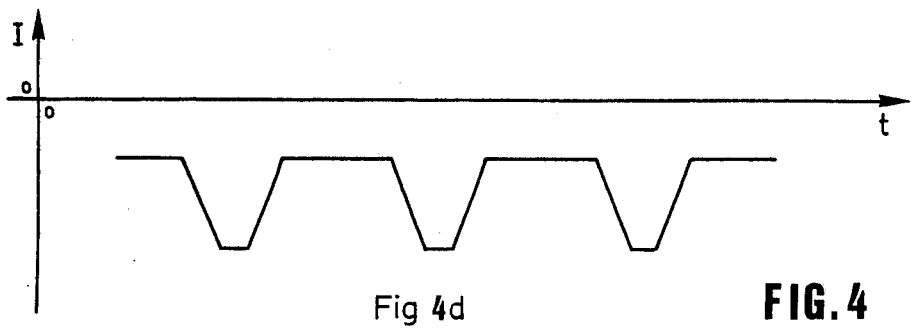
Fig 4d
FIG. 4

POWER SUPPLY TESTING APPARATUS

FIELD OF THE INVENTION

The present invention relates to equipment for testing mass produced DC power supplies which require a large number of rapid checks, and more particularly to equipment for automatically controlling: the parameters of an excitation source for the supplies, the impedance of a load for the supplies, and measuring means responsive to inputs and outputs of the supplies.

BACKGROUND OF THE INVENTION

The vast growth in electronics and in data processing is making it increasingly necessary for DC power supplies (AC to DC converters with filters and possibly feedback regulating circuits) to be mass produced in large numbers. For customer satisfaction, the manufacturers of such power supplies must sell power supplies which are guaranteed to work. The same is true for constructors of data processing systems who employ the power supplies in their systems. These data processing power supplies are either purchased directly from a special manufacturer or are produced by the constructor himself. In either case the power supplies must be subjected to rigorous tests to ensure that the system which they supply operates satisfactorily. In the present state of the art with which we are familiar, testing equipment does not combine both speed and the ability to handle the large number of tests which are made on the power supplies. In fact, all previous checking equipment of which we are aware requires a large number of manual actions on the part of a technician in charge of testing a particular supply.

The prior art equipment generally includes a measuring unit which allows measurement to be made, on the one hand, of the various levels of AC current activating the DC power supply and, on the other hand, of the voltage levels which appear at the terminals of a load connected to output terminals of the power supply to be tested. Each time that the technician wishes to check the input and output levels under different operating conditions he has to perform manual actions which involve:

1. Adjusting a measuring unit, which consists chiefly of a voltmeter for measuring the input and output voltages of the power supply; and
2. Altering the level of the AC input voltage and the value of the impedance of a load arranged across the output terminals of the power supply. Each of the values read from the measuring unit must, moreover, be noted with a pencil and paper or the like, so that they can either be entered on a log sheet which accompanies the power supply and relates to the operating tests, or to enable a faultfinder to locate a fault when the values measured at the output from the power supply are not what they should be in normal operation, for given AC input currents.

An object of the present invention is to provide new and improved apparatus for high speed checking of power supplies before use or delivery. Another object is to provide an apparatus for improving the standard of tests made on power supplies by eliminating all manual operations while the measurements are being made, while increasing the number of checks by automating the measurement process.

BRIEF DESCRIPTION OF THE INVENTION

The invention provides an equipment for testing DC power supplies which is chiefly characterized in that it comprises:

1. Circuits for adjusting distinguishing characteristics of AC current supplied from AC power mains to a power supply to be tested; these circuits are connected between the main AC electrical supply and an input of the tested power supply;
2. At least one programmable load connected to the output terminals of the tested power supply; the impedance of the load is controlled by an automatic program;
3. Fixed auxiliary power supplies for supplying DC current to circuits for controlling and starting the tested power supply;
4. Programmable auxiliary power supplies for supplying a primary DC current to the tested power supply;
5. A unit for measuring the characteristics of the input and output currents to and from the power supply and for measuring the currents at various points in the equipment;
6. A control member for: adjusting the AC current supplied by the main supply, adjusting the programmable auxiliary sources, and selecting the points at which measurements are taken by the measuring unit; and
7. A unit for displaying the measurements made by the measuring unit and the commands derived by the control member.

The above and still further objects, features and advantages of the present invention will become apparent upon consideration of the following detailed description of one specific embodiment thereof, especially when taken in conjunction with the accompanying drawing.

BRIEF DESCRIPTION OF THE DRAWING

FIGS. 4a–4d are illustrations of different forms of output current in a load fed by a power supply while it is being tested.

DETAILED DESCRIPTION OF THE DRAWING

Figure 1:
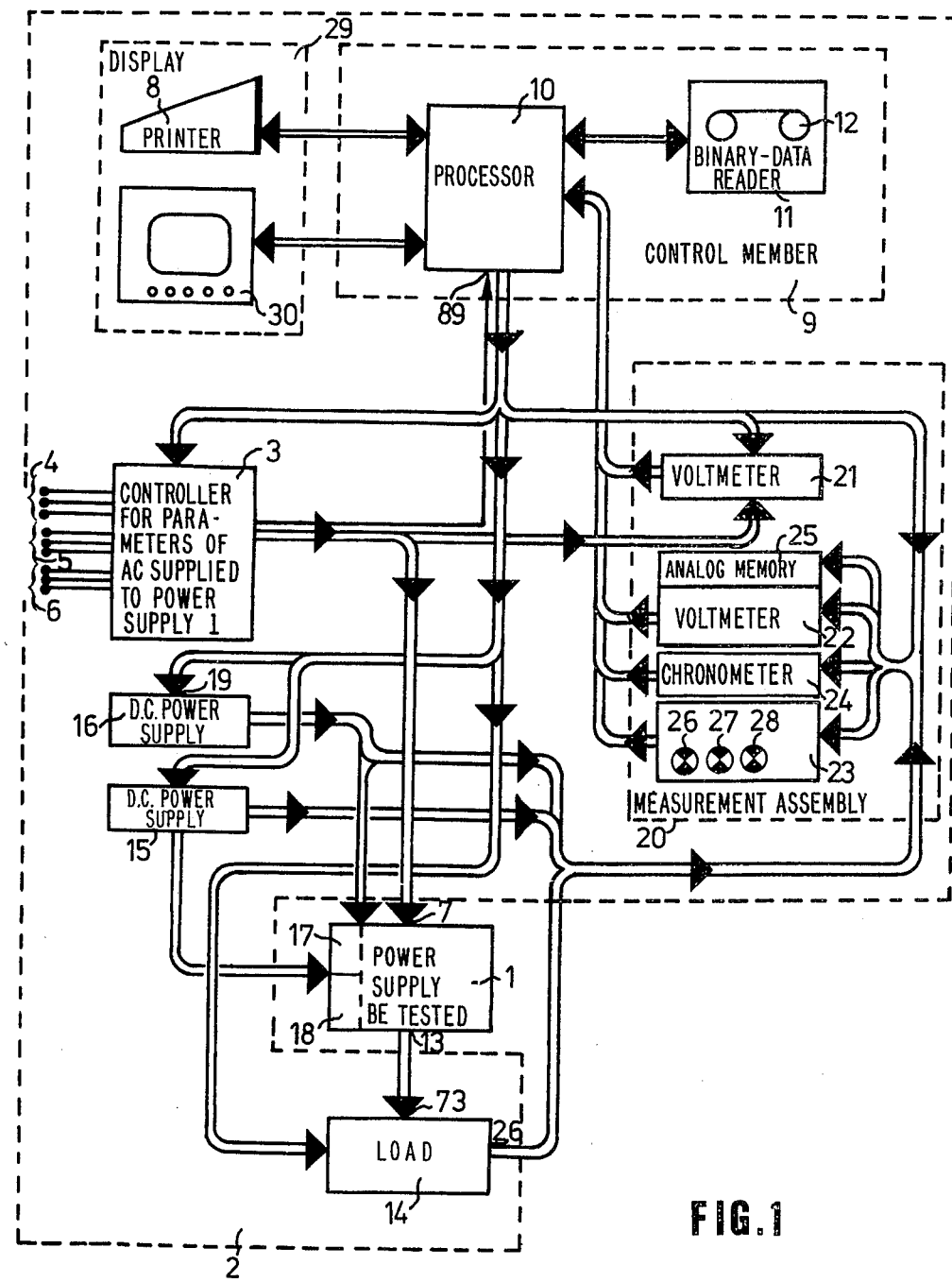
FIG. 1 is an illustration of the general layout of one embodiment of checking equipment according to the invention.

A general layout of a preferred embodiment of the equipment 2 of the invention for testing power supply 1 is first described with reference to FIG. 1.

The equipment 2 contains controller 3 which makes it possible to adjust the characteristics, i.e., parameters, of the AC current supplied to the power supply 1 being tested; exemplary of the characteristics are the current and voltage amplitudes, as well as frequency of the excitation source for supply 1. Controller 3 is responsive to the electrical supplies derived from AC mains connected to three sets of 3 phase terminals 4–6 and feeds one of these supplies to inputs 7 of power supply 1. One preferred embodiment of controller 3 is described in French pat. application No. 75 13460, filed Apr. 29, 1975, in the name of the present applicants. Three-phase sinusoidal currents of differing frequencies are derived from terminals 4, 5 and 6, with typical frequencies derived from these terminals being 50 Hertz, 60 Hertz, and 400 Hertz, respectively. Controller 3 includes circuitry for selecting which one of the three frequencies derived from terminals 4–6 is supplied to power supply 1, and circuitry for adjusting the voltage amplitude of each phase of the selected frequency with respect to a reference neutral. Controller 3 is controlled by signals derived from a control member 9, formed by a processor 10 associated with a reader 11 for reading binary data from an appropriate source, e.g., a magnetic tape. The processor may, for example, be the H316 type manufactured by Honeywell. Further details of controller 3 which set the characteristics of AC current supplied to the power supply to be tested will be given infra, with reference to FIG. 2.

Connected to output 13 of power supply 1 to be tested is at least one load circuit 14, preferably of the transistorized type. The impedance of load 14 is programmably controlled in response to output signals of control member 9. One preferred embodiment of load 14 is described in French patent application No. 75 13562, filed Apr. 29, 1975, in the name of the present applicants; details required to understand the way in which load 14 operates in connection with the present invention are described with reference to FIG. 3.

Also shown in FIG. 1 are auxiliary, conventional DC power supplies 15 and 16 which are controlled by signals derived from control member 9. Auxiliary power supply 15 supplies a fixed DC voltage to conventional DC power supply control circuit 17 and starting circuit 18 for power supply 1 to be tested. Control circuit 17 may be formed, for example, by logic circuits for selecting filters contained in power supply 1 in accordance with the frequency of the AC current supplied to the power supply by controller 3. Starting circuit 18 may also be formed by logic circuits which cause the power supply to be put into operation. The logic circuits included in circuits 17 and 18 operate at a constant DC voltage and are powered by the constant DC output voltage of supply 15.

Auxiliary power supply 16 is programmed to derive different DC output levels in response to control signals supplied to its input 19 by control member 9. Exemplary of a suitable device for power supply 19 is the Sodilec 6010. Supply 16 is capable of supplying a periodically varying DC voltage (e.g., a chopped DC) to power supply 1 in the event of supply 1 being normally responsive to such a voltage, instead of an AC output of controller 3.

The equipment also includes a measurement assembly 20 which determines the characteristic values of the AC current supplied to power supply 1, as well as the values of currents drawn by load 14. Measuring assembly 20 includes two voltmeters 21 and 22 (preferably VT 2050 types which are marketed by Schneider Electronique-Rungis Company), an analogue voltage comparator 23, a chronometer 24 and an analog memory 25. It is controlled by control member 9.

Voltmeter 21, connected to be responsive to the AC output of controller 3, is capable of measuring, for each frequency and each phase of the AC output of controller 3, the voltage between the phase in question and neutral. Voltmeter 22 measures the AC and DC voltages and currents supplied to and derived from power supplies 1, 15, 16 and load 14. Analog memory 25 responds to and stores the values of the voltage peaks derived from terminals 26 of load 14. Chronometer 24 responds to processor 10, load 14, and supplies 15 and 16 to indicate the maintenance times and switching on times of power supply 1.

The analog voltage comparator 23 is connected to be responsive to the same voltages as voltmeter 22. Comparator 23 contains first and second variable threshold detectors for respectively detecting upper and lower voltage levels. As an example, these detectors enable the occurrences of drop-out voltages of the power supply, in the case of a surge voltage, to be determined with respect to predetermined thresholds. Indicator lights 26, 27 and 28 enable an operator in charge of the checking equipment to ascertain the voltage measurement with reference to the thresholds. Activation of lamp 26 indicates that the voltage is less than the lower threshold; energization of lamp 27 indicates the monitored voltage is between the two thresholds; activation of lamp 28 indicates the voltage is above the upper threshold. The threshold detectors may, for example, be of the type described in U.S. Ser. No. 52111 or Ser. No. 72311, or as described in the publication entitled "The Linear and Interface Circuits Data Book", pages 6 to 16, published by Texas Instruments in 1973.

Finally, the checking equipment contains display unit 29 which displays the measurements made by the measuring assembly and orders given by control member 9. Display unit 29 is responsive to control signals supplied by processor 10 to equipment 2 and includes a cathode ray tube display system 30 and a printer 8 which logs a permanent record of the operations and measurements on paper. The display system allows the operations and the test results to be followed without delay. In this way it is possible for each tested power supply to be given a performance check chart which is very useful in the event of faults.

Figure 2:
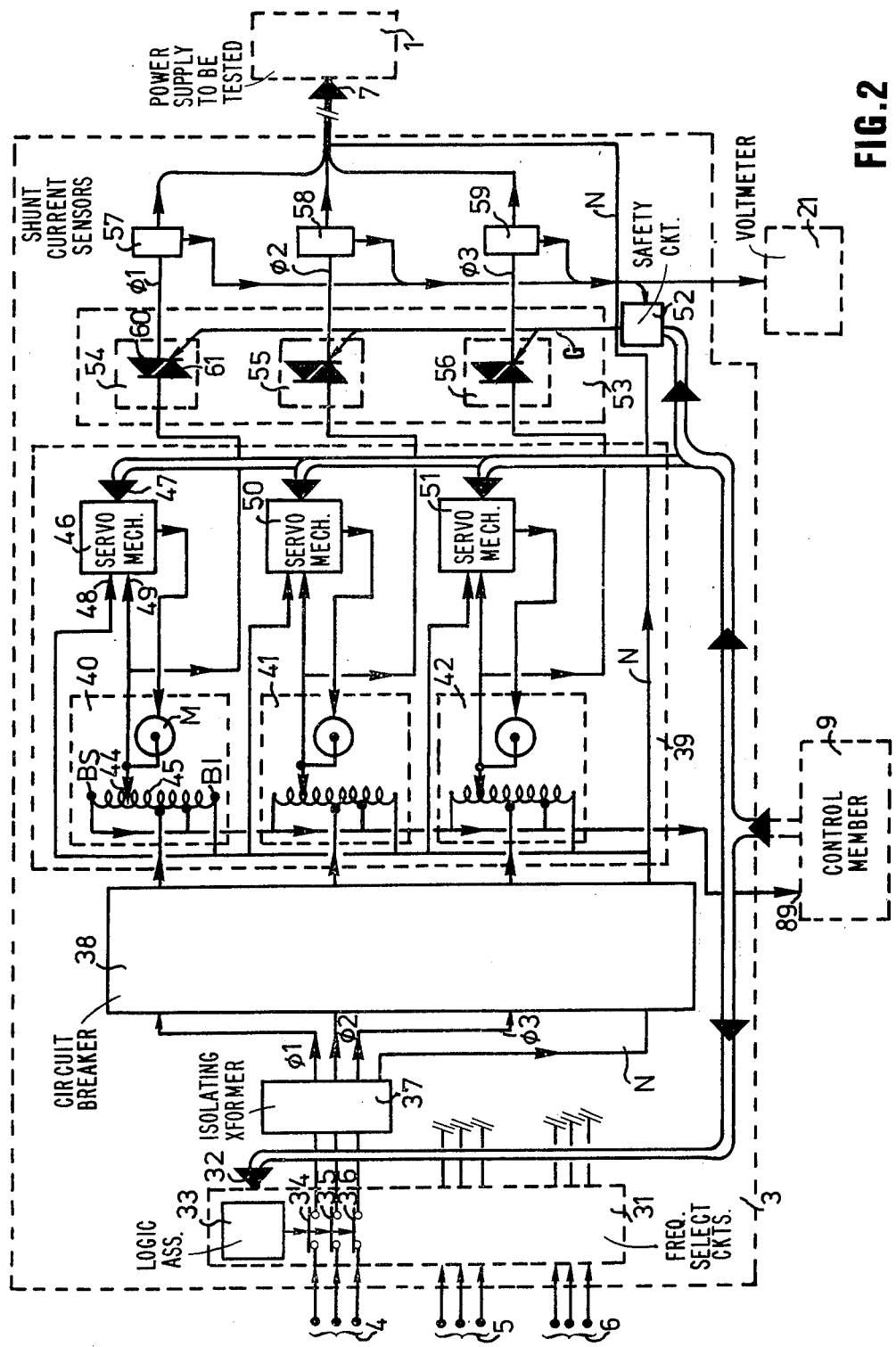
FIG. 2 is a circuit diagram of the means for controlling the characteristics of the AC current supplied by the mains to the tested power supply.

Controller 3 which adjusts the characteristics of the AC current supplied to the power supply will now be described with reference to FIG. 2. For reasons of simplicity, controller 3 is illustrated in detail for only one group of terminals 4 of the three-phase AC main supply. It is to be understood that corresponding circuitry is provided, as necessary, for terminals 4 and 5.

Controller 3 contains frequency selection circuits 31 which are connected to 3 phase terminals 4–6 of AC mains of three different frequencies to control the selection of the frequency of the AC current which is used to test supply 1. Frequency selecting circuits 31 are controlled in response to signals coupled to input 32 by control member 9. To select a frequency, control member 9 emits control signals which cause logic assembly 33 to actuate three relay contacts for each set of terminals 4–6; in the illustrated example, contacts 34–36 for the three phases of the 50 Hertz supply connected to terminals 4 are energized. Logic assembly 33 is preferably of a type described in the French Pat. application No. 75 13460 which was filed on Apr. 29, 1975, in the name of the present applicants.

The three-phases of the current passed through contacts 34–36 are supplied to isolating transformer 37 which isolates the supply terminals 4 from inputs 7 of power supply 1. Transformer 37 is a three-phase transformer having a star output arrangement, with one grounded output terminal for the neutral N and three terminals for each of the phases $\phi 1$, $\phi 2$, $\phi 3$.

The outputs of isolating transformer 37 are connected to a circuit-breaker 38 for cutting off the phases of the AC current in response to detection of an AC leak to ground. Circuit-breaker 38 is preferably of the differential type, such as that described in a publication by M. Castello, entitled "Cle des Schemas Electriques", pages 77 to 78, published by Editions Dunod, Paris, in 1965.

Circuit-breaker 38 includes four outputs respectively corresponding to neutral N and each of the phases φ1, φ2, φ3 and which are connected to circuit 39 for adjusting the voltage between each phase and neutral. Circuits 39 include three variable auto transformers 40, 41 and 42, one of which is provided for and is responsive to each of the phases φ1, φ2, and φ3, as well as neutral N so that the inputs of transformers are between the phase in question and neutral. The output voltages of transformers 40–42 are adjusted by wipers 44 which move across coils 45. Rotation of the motors for controlling auto transformers 40–42 is respectively controlled by servo mechanisms 46, 50 and 51 which are in turn controlled by member 9.

Since servo mechanisms 46, 50 and 51 are alike, a description of servo mechanism 46 suffices for all three. Servo mechanism 46 includes an input 47 responsive to a signal from member 9 and corresponding to the level of the voltage required for testing supply 1. Servo mechanism 46 also includes inputs 48 and 49 respectively connected to neutral (N) and to autotransformer wiper 44. Thus, servo terminal 47 is responsive to a signal representing the desired voltage level of phase φ1 relative to neutral while terminals 48 and 49 respond to the actual voltage level between phase φ1 and neutral N. An example of such a servo mechanism is described in the book "Circuits Electroniques" by M. Oemichen, Edition Radio, 1954, page 228.

Servo mechanism 46 causes motor M to rotate through an angle such that wiper 44 stops at a point along the winding of transformer 45 where the voltage between phase φ1 and neutral N corresponds to the required voltage at terminal 47. The winding of transformer 45 is provided with upper and lower stops BS and BI which respectively correspond to the maximum and minimum voltages between phase φ1 and neutral N. When wiper 44 reaches upper and lower stops BS and BI, a determination can be made for phase φ1 as to whether servo mechanism 46 is operating correctly.

Controller 3, which adjusts the AC currents supplied to power supply 1, also includes an electronic circuit-breaker 53 to allow each phase to be cut off at any time. Circuit-breaker 53 is formed by bi-polar electronic switches 54, 55 and 56, each of which comprises two thyristors connected in anti-parallel in a Triac circuit; illustrated thyristors 60, 61 are those included in switch 54. A common trigger G for switches 54–56 is derived by safety circuit 52 when an excessively high current is derived from one of switches 54–56, as sensed by shunt current sensors 57, 58 or 59. Safety circuit 52 may, for example, be formed by a current threshold detector which emits a cut-off signal whenever a current threshold associated with any one of sensors 54–56 is exceeded. The cut-off signal may also be derived from control member 9, should any incidents occur. Hence, voltmeter 21 and current sensors 57, 58 and 59 enable measurements to be made of the current in each phase for each frequency selected at the input to power supply 1. Thus, the controller 3 which sets the characteristics of the AC current supplied to power supply 1 contains dual safety measures, namely a self-contained circuit-breaker 38 of the differential type and an electronic circuit-breaker 53 which is triggered by control member 9 or by current sensors 57, 58 and 59.

The voltage levels for each phase, as measured by voltmeter 21, are recorded on paper by printer 8 each time a measurement is made. Controller 3 allows power supply 1 to be tested at each different frequency and voltage at which it is expected that the power supplies will be operated.

Figure 3:
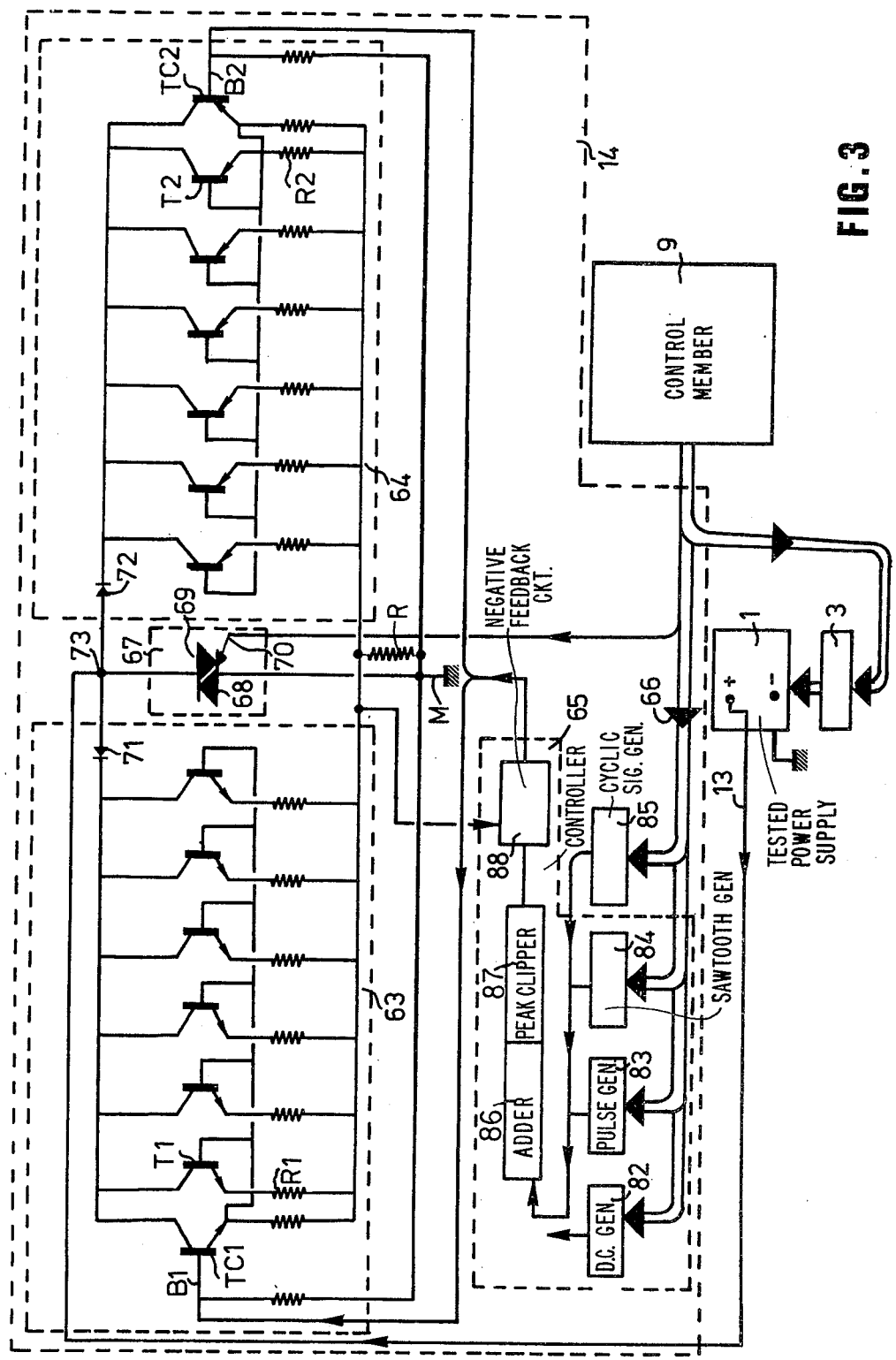
FIG. 3 is a circuit diagram of an adjustable load connected to the output of the tested power supply.

Reference is now made to FIG. 3, wherein there is illustrated a circuit diagram of programmable transistorized load 14 which is connected to output 13 of power supply 1. While the description of FIG. 3 deals with only one load, the equipment could clearly include a number of identical loads.

Load 14 contains two load units 63 and 64 which carry currents of opposite polarities. Load unit 63 allows the power supply to be checked when the load is connected between a positive (+) output terminal of power supply 1 and ground M, while load unit 64 is operative when the load is connected between a negative (−) output terminal of power supply 1 and ground M. Controller 65 adjusts the value of transistorized load 14 in response to signals supplied by control member 9 to buss 66. Details of controller 65 are given infra. Transistorized load 14 is selectively short circuited by bipolar electronic switch means 67 that is connected across units 63 and 64, as well as supply 1, to ground M. Switch means 67 is controlled by control member 9 and includes two thyristors 68, 69 which are connected in anti-parallel in an arrangement of the Triac type. Thyristors 68, 69 include a common trigger 70 which receives a signal from control member 9 to establish a short circuit through the thyristors from lead 13 to ground M.

Load units 63 and 64 are formed by bipolar transistors of opposite conductivity types, whereby units 63 and 64 respectively include NPN and PNP transistors T1 and T2. The emitter collector paths of the transistors in both units are connected in parallel with output lead 13 of tested power supply 1. Biasing resistors R1 and R2 are respectively connected to the emitters of each of transistors T1 and to the emitters of each transistors T2. A common terminal for resistors R1 and R2 is connected to ground M through a common resistor R. The bases of transistors T1 are connected to a first common terminal, while the bases of transistors T2 are connected to a second common terminal. The bases of transistors T1 and T2 are responsive to first and second control signals from controller 65; the first and second control signals respectively program the impedance values of transistorized load units 63 and 64 via NPN and PNP control transistors TC1 and TC2, having emitter collector paths in parallel with those of transistors T1 and T2. The bases B1 and B2 of transistors TC1 and TC2 are supplied with control signals from controller 65. Rectifiers 71 and 72 having cathodes respectively connected to the collectors of transistors T1, TC1 and T2, TC2, prevent the passage of reverse currents in both of units 63 and 64 to prevent damage to the transistors. Resistor R between the common terminal for resistors R1 and R2 and ground sets the level of current drawn from power supply 1 by the transistorized load 14.

Controller 65 for enabling the impedance magnitude of load 14 to be adjusted includes several generators responsive to control signals derived by control member 9. These generators are:

a DC generator 82 which supplies a DC reference current, the magnitude of which is set by control member 9;

a generator 83 for generating cyclic variable frequency and variable rise time pulse type signals; there are four different preselected values for the frequencies as well as the rise times; and a generator 84 for generating variable slope saw tooth signals in the form of current ramps.

The impedance magnitude of load 14 may also be programmed by a programmable generator 85 for generating cyclic, pulse type signals which are common to all the loads which the equipment may include. The frequency and rise times of the output of programmable generator 85 may be arbitrarily selected from any of 250 frequency values and from any of 250 different rise time values. Such a generator is available from Hewlett-Packard.

The outputs of generators 82–85 are connected to adder 86 that drives peak-clipper 87. A negative feedback circuit 88 responds to a control signal derived from clipper 87 and a feedback signal indicative of the current through load 14, as indicated by the voltage across the terminals of resistor R. Peak-clipper 87 makes it possible to set the amplitude of the AC current supplied by the power supply to transistorized load 14, while feedback circuit 88 slaves the current supplied by power supply 1 to load 14 to the current derived from clipper 87.

An example of an adder is described in a book by M. Oemichen, entitled "Circuits Electroniques", page 91, FIG. 76, Editions Radio, Paris 1960. The peak-clipper may be formed by a circuit containing transistors operating in a saturated state, as described in the book entitled "Emploi Rationnel de Transistors", page 64, Editions Radio, Paris 1963.

Positive and negative currents with respect to ground M may be selectively supplied by generators 82–85 to transistors TC1 and TC2 to control the polarization and magnitude of the impedance presented by load 14 to tested power supply 1.

Transistorized load 14 operates during testing as follows:

a. The load is connected by its terminals M and 73 to output 13 of power supply 1;

b. After the power supply has been switched on, ramp generator 84 of signal generator 65 initially supplies a current ramp to the base of one of control transistors TC1 or TC2, depending upon the polarity of the voltage derived by supply 1 on lead 13; for purposes of example, assume that the voltage on lead 13 is positive, whereby a positive ramp is derived by generator 84 to control the impedances of transistors T1. Since a constant voltage is supplied by supply 1 to terminals 73 and M of load 14, the impedance of load unit 63 between terminals 73 and M decreases as the ramp rises, while the current supplied by the power supply 1 to the load unit is slaved to the current ramp supplied by generator 65 plus the DC current supplied by generator 82;

c. Thereafter, generators 83 and 85 may be selectively and sequentially connected, one at a time, to adder 86 so that differing load impedances are established.

Thus, regardless of the wave form of the signals supplied by generator 65, transistorized load 14 forces power supply 1 to provide current of the same wave form. Measurements of this output current are made by voltmeter 22, as illustrated in FIG. 1. The results of the measurements are printed out by means of printer 8. The load may be short-circuited at any time by short-circuiting switch 67.

The values for the frequency form factor and rising edges of alternating signals derived by generator 65 are set by control member 9. Two examples of different current wave forms that may be derived by supply 1 in response to variations of load 14 that are caused by generator 65 are illustrated in FIG. 4. In FIG. 4a there are shown, along the ordinate, amplitude changes for two cycles of load current I when power supply 1 is generating a positive current ramp that is supplied to unit 63. The current level I1 reached at the end of the ramp is determined by peak-clipper 87 included in generator 65, while base value I2 is determined by DC generator 82. In FIG. 4b there is shown the intensity of load current I when power supply 1 is supplying a negative current ramp to unit 64.

In FIG. 4c there is shown the load current when power supply 1 is supplying a positive, nonsinusoidal cyclic current, which flows in unit 63 of FIG. 3. The slope of positive edges 74, as well as the frequency and form factor of the AC current, is set by the control member 9 which acts on generator 65. In FIG. 4d, there is shown the intensity of the current I in the load when the power supply derives a negative AC current similar to the wave form of FIG. 4c.

The testing equipment which has just been described makes it possible to check power supplies capable of deriving positive or negative DC currents, with respect to a reference earth. By way of example, the capabilities of the equipment are as follows:

a. The value of the DC current supplied by power supply 1 to one of the transistorized loads 14 may be set by control member 9 acting on generator 65 from 0 to 50 amperes in steps of 200 milliamps.

b. The amplitude of the AC current supplied by power supply 1 to load 14 may be varied from 0 to 50 amps in steps of 0.2 amps. There are four possible testing frequencies and periods T of nonsinusoidal periodic variations, e.g., as illustrated in FIG. 4c, may be selected from four possible values. It is also possible to select different rise times and slopes of the nonsinusoidal periodic variations.

c. The amplitude of current ramps supplied by power supply 1 to load 14 may be varied from 0 to 50 amps in steps of 0.2 amps.

d. The 50 Hertz three-phase AC current supplied to power supply 1 enables the power supply to derive an output voltage from 0 to 250 volts between one phase and neutral. For a 60 Hertz excitation frequency for supply 1, the supply derives an output from 0 to 240 volts.

This equipment enables rigorous testing of power supplies with large differences in the alternating current fed to the power supplies and under widely differing output conditions. It also makes a considerable reduction in the testing time. In fact, for the less rigorous checking possible with existing equipment the testing time is 45 minutes, whereas with the equipment of which an example has just been described, this time is reduced to 4 minutes.

While there has been described and illustrated one specific embodiment of the invention, it will be clear that variations in the details of the embodiment specifically illustrated and described may be made without departing from the true spirit and scope of the invention as defined in the appended claims.

What we claim is:

1. An equipment for testing DC power supplies, comprising:

i. a controller for setting the characteristic parameters of AC current supplied by a main supply to the power supply to be tested, said controller being connected between the electrical supply and inputs of the power supply to be tested, ii. at least one programmable load connected to output terminals of the power supply to be tested, iii. fixed auxiliary power supplies for feeding DC current to the controller for controlling and starting the power supply to be tested, iv. programmable auxiliary power supplies for supplying a primary DC current to the power supply to be tested, v. an assembly for measuring the values of input and output currents supplied to and derived from the power supply, vi. a control member, said control member including means for supplying control signals to: (a) the controller so that the controller can set the parameters of the AC current supplied by the electrical supply, (b) the programmable auxiliary supplies so that the programmable supplies can derive variable DC output voltages, (c) the measuring assembly so that measurements can be derived from differing terminals in the equipment, and (d) the load, so that different impedance values can be set in the load, and vii) an assembly responsive to the control signals and signals indicative of measurements received by the measuring assembly for displaying the measurements made by the measuring assembly and the controls generated by the control member.

2. The testing equipment of claim 1 wherein the programmable load comprises:

a first transistorized load unit capable of carrying a current of a first polarity with respect to a DC reference level, a second transistorized load unit capable of carrying a current of a second polarity with respect to the said DC reference level, means for adjusting the value of said load units, said adjusting means being connected to control the first and the second load units and to be responsive to the control member, and means for short circuiting the load, said short circuiting means being connected to control the said first and second load units and to be responsive to the control member.

3. The testing equipment of claim 1, wherein the main AC supply is a multiple phase source controller which includes:

circuit means for selecting the frequency of the AC current supplied by the main supply to the supply being tested and circuit means for adjusting the voltage between each phase of the AC supply and a neutral terminal responsive to the main AC supply.

4. The testing equipment of claim 3, wherein the measurement assembly includes:

an analog comparator responsive to the tested power supply and for indicating the voltage of the tested supply relative to upper threshold and lower threshold voltages, a chronometer for indicating the switching on times of the tested power supply and the times when maintenance is provided to the tested power supply, a first voltmeter for measuring the voltage between each phase and the neutral of the AC current supplied to the tested power supply, a second voltmeter for measuring at any time the voltages in the tested power supply and the equipment.

5. The testing equipment of claim 4, wherein the control member comprises:

a processor capable of generating signals to cause tests to be made on the tested power supply, means for reading binary checking data carried on a recording medium, and means for coupling the binary data read from the reader means to the said processor.

6. The testing equipment of claim 5 wherein the display assembly comprises:

a printing device connected to the processor and the assembly for indicating the results of the measurements made by the said measuring assembly, and a display member with a screen for displaying the orders and measurements which occur while each power supply is being checked.

7. Apparatus for testing power supplies under differing load conditions and differing excitation conditions, said power supplies having power input excitation terminals and power output terminals, comprising means for selectively connecting excitation sources having differing parameters to said input terminals, a variable impedance load, means for connecting said load to said output terminals, means for controlling the impedance of said load, voltage measuring means, readout means responsive to the measuring means, means for connecting said measuring means and readout means to be responsive to the voltage derived from the selective connecting means and the voltage across the load, a dynamic signal source for deriving first, second, and third control signals for respectively controlling the parameters of the excitation sources, the impedance of the load, and the connections of the readout means and measuring means, and means responsive to said first, second, and third signals for respectively controlling the parameters of the excitation sources, the impedance of the load and connections of the readout means and measuring means.

8. The apparatus of claim 7 wherein the load includes polarized, variable impedance conductors, and the means for controlling the load includes means for controlling the direction and the magnitude of current flow through the conductors in response to the second control signal, said last named means including means for dynamically varying the impedance of the conductors.

9. The apparatus of claim 8 wherein the means for dynamically varying includes means for causing the load current to vary with a ramp waveform.

10. The apparatus of claim 9 further including means for varying the slope of the ramp in response to a control signal from said dynamic signal source.

11. The apparatus of claim 8 wherein the means for dynamically varying includes means for causing the load current to vary with a periodic waveform having sloping edges and substantially constant maximum and minimum levels.

12. The apparatus of claim 11 further including means for varying the period of the waveform and the slope of the edges in response to a control signal from said dynamic signal source.

13. The apparatus of claim 8 further including means for selectively short circuiting said load across the output terminals in response to a control signal from said dynamic signal source.

14. The apparatus of claim 7 further including means for selectively short circuiting said load across the output terminals in response to a control signal from said dynamic signal source.

15. The apparatus of claim 7 wherein the means for connecting excitation sources to the input terminals includes means responsive to a control signal derived from the dynamic signal source for selectively connecting AC sources of differing frequencies to the input terminals.

16. The apparatus of claim 15 further including means responsive to a control signal derived from the dynamic signal source for connecting different filter circuits in circuit with the power supply as a function of the frequency applied to the input terminals.

17. The apparatus of claim 15 further including means responsive to a control signal derived from the dynamic signal source for controlling the amplitude of the AC voltage applied to the input terminals.

18. The apparatus of claim 7 wherein the readout means includes means responsive to the dynamic signal source and the measuring means for displaying (a) the parameters of the source exciting the input terminals, (b) the load impedance, and (c) the measured voltage for different conditions established by the dynamic signal source.

* * * * *